(12) United States Patent　　(10) Patent No.: US 9,412,839 B2
Akarvardar　　(45) Date of Patent: Aug. 9, 2016

(54) METHODS OF FORMING REPLACEMENT GATE STRUCTURES ON FINFET DEVICES AND THE RESULTING DEVICES

(71) Applicant: GLOBALFOUNDRIES Inc., Grand Cayman (KY)

(72) Inventor: Murat Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/535,942

(22) Filed: Nov. 7, 2014

(65) Prior Publication Data

US 2016/0133720 A1　　May 12, 2016

(51) Int. Cl.
*H01L 29/66*　　(2006.01)
*H01L 29/40*　　(2006.01)
*H01L 21/311*　　(2006.01)
*H01L 21/02*　　(2006.01)

(52) U.S. Cl.
CPC .... *H01L 29/66545* (2013.01); *H01L 21/02164* (2013.01); *H01L 21/02362* (2013.01); *H01L 21/02592* (2013.01); *H01L 21/02595* (2013.01); *H01L 21/311* (2013.01); *H01L 29/401* (2013.01); *H01L 29/66553* (2013.01); *H01L 29/66795* (2013.01)

(58) Field of Classification Search
CPC combination set(s) only.
See application file for complete search history.

(56) References Cited

U.S. PATENT DOCUMENTS

| | | |
|---|---|---|
| 7,915,139 B1 | 3/2011 | Lang et al. |
| 8,084,346 B1 | 12/2011 | Guo et al. |
| 2005/0158934 A1 | 7/2005 | Yun et al. |
| 2013/0187228 A1 | 7/2013 | Xie et al. |
| 2014/0084383 A1* | 3/2014 | Cai ................... H01L 29/66545 257/401 |
| 2014/0110794 A1 | 4/2014 | Xie et al. |
| 2014/0306297 A1 | 10/2014 | Ching et al. |

OTHER PUBLICATIONS

Office Action from related U.S. Appl. No. 14/535,852 dated Feb. 2, 2016.

* cited by examiner

*Primary Examiner* — Mohammad Islam
*Assistant Examiner* — Ratisha Mehta
(74) *Attorney, Agent, or Firm* — Amerson Law Firm, PLLC

(57) ABSTRACT

One illustrative method disclosed herein includes, among other things, forming at least one layer of insulating material with a substantially planar upper surface that is positioned above the upper surface of the fin, forming a layer of sacrificial gate material on the layer of insulating material, the layer of sacrificial gate material having an as-deposited upper surface and a substantially uniform thickness, forming a layer of gate cap material on the as-deposited upper surface of the layer of sacrificial gate material, forming a patterned sacrificial gate structure comprised of at least the gate cap material and the sacrificial gate material, forming a sidewall spacer adjacent the patterned sacrificial gate structure, removing the patterned sacrificial gate structure and replacing it with a replacement gate structure.

12 Claims, 15 Drawing Sheets

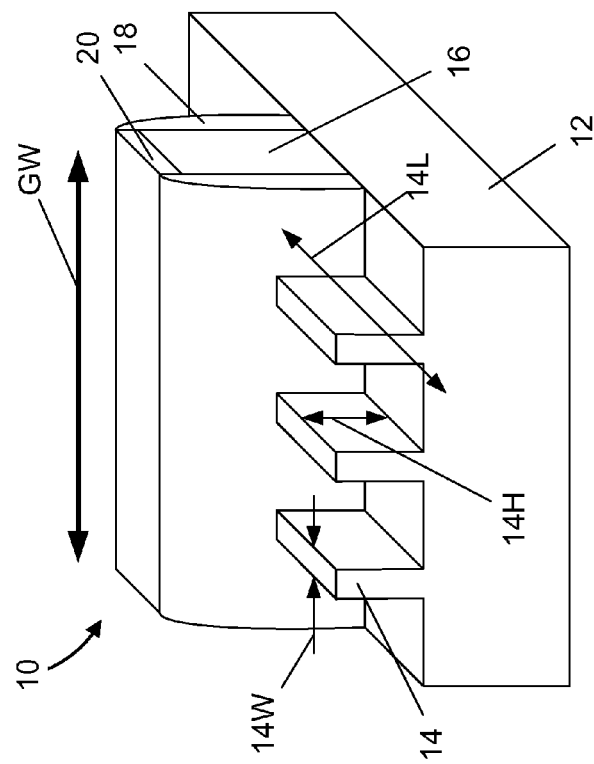
Figure 1A (Prior Art)
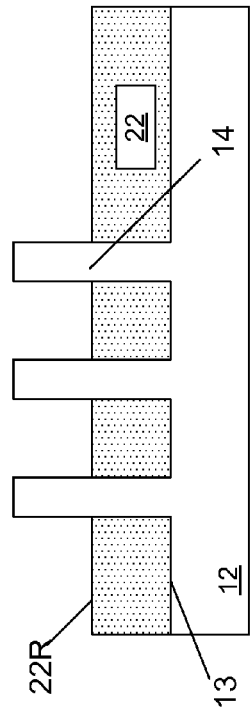
Figure 1B (Prior Art)
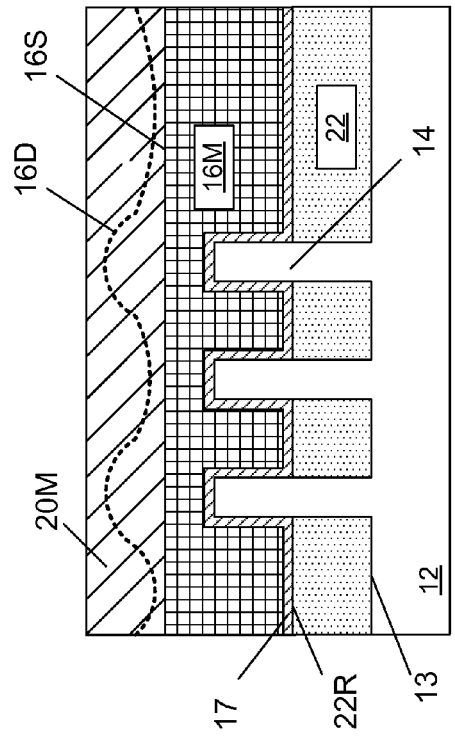
Figure 1C (Prior Art)
Figure 1D (Prior Art)

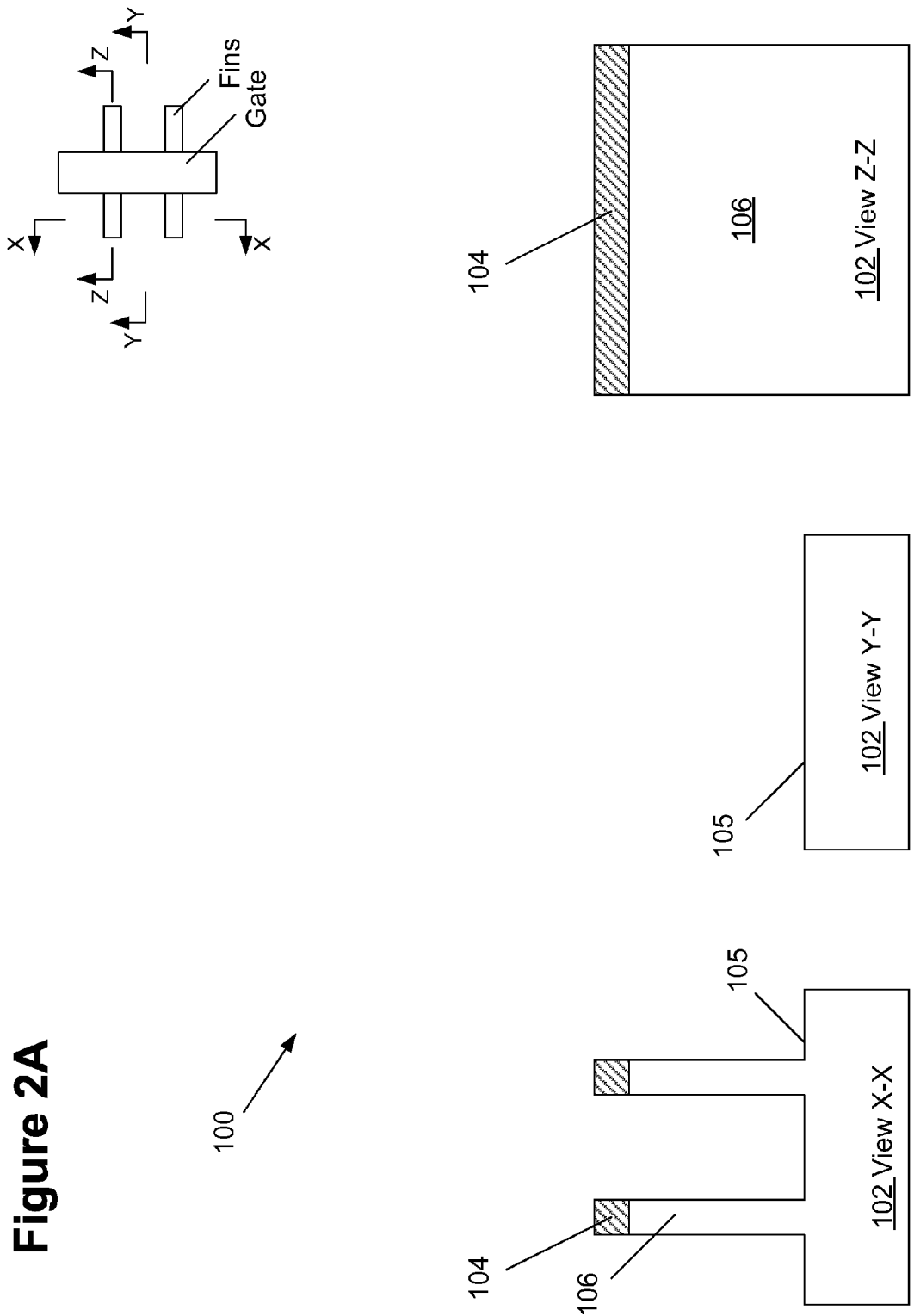

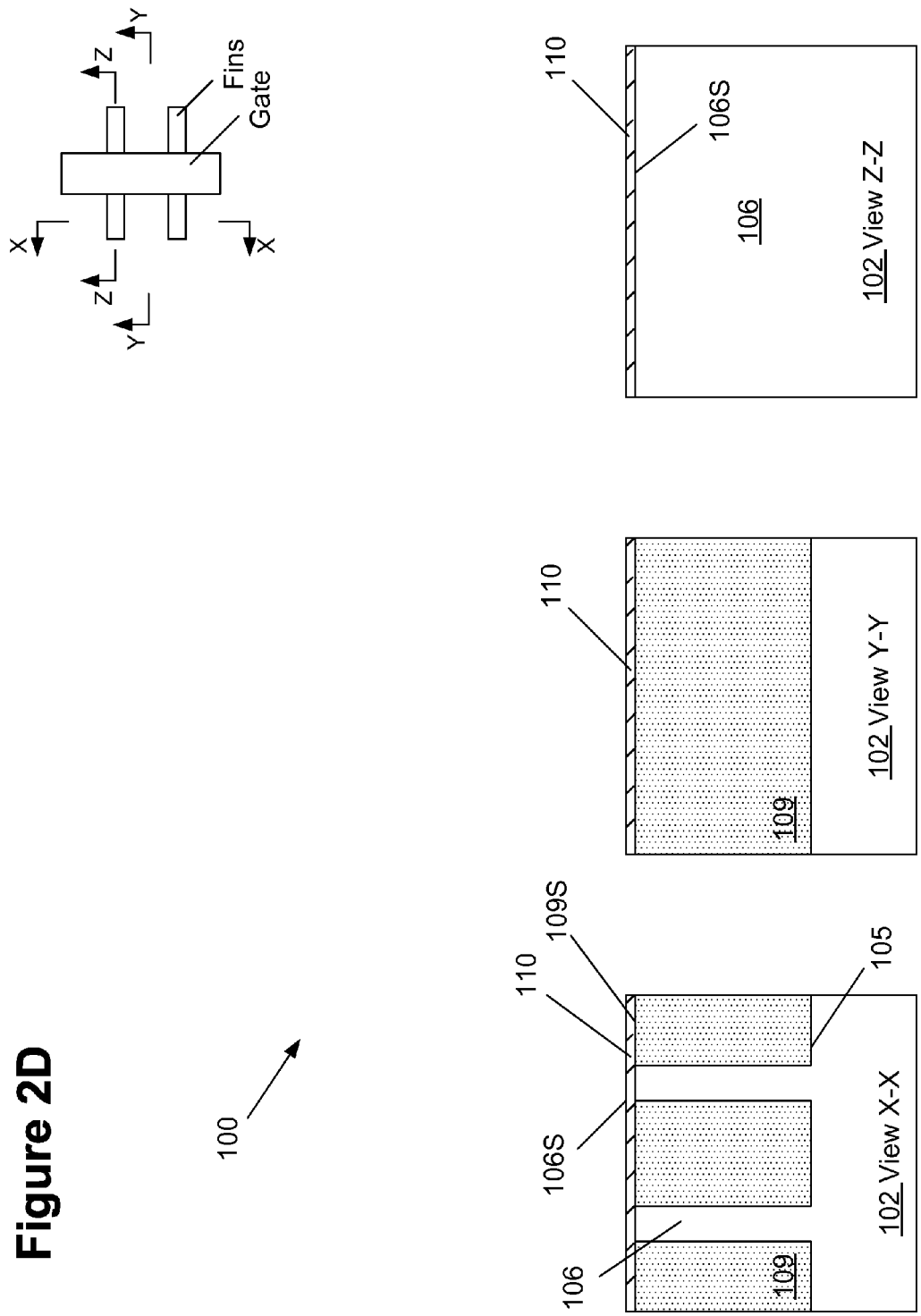

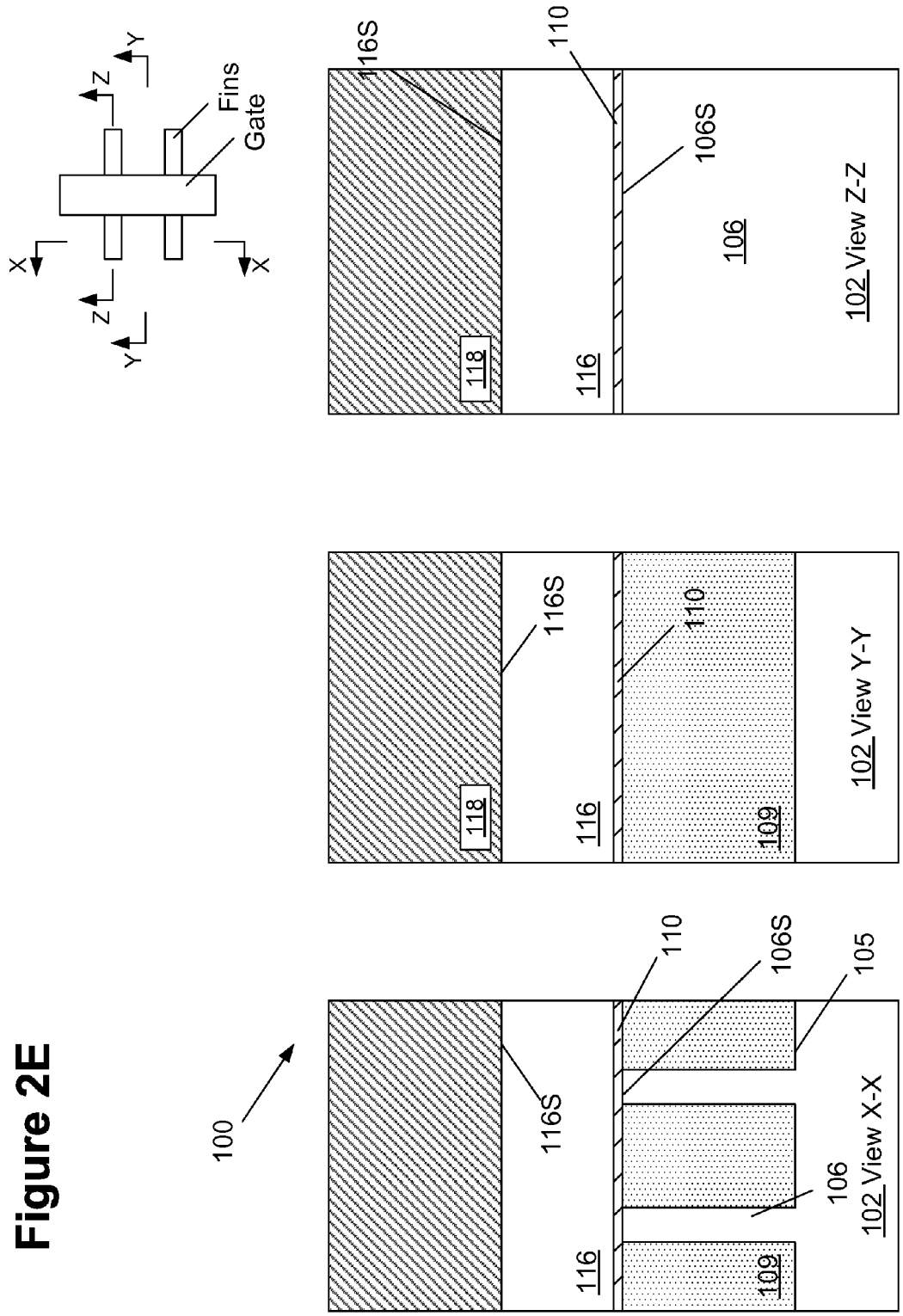

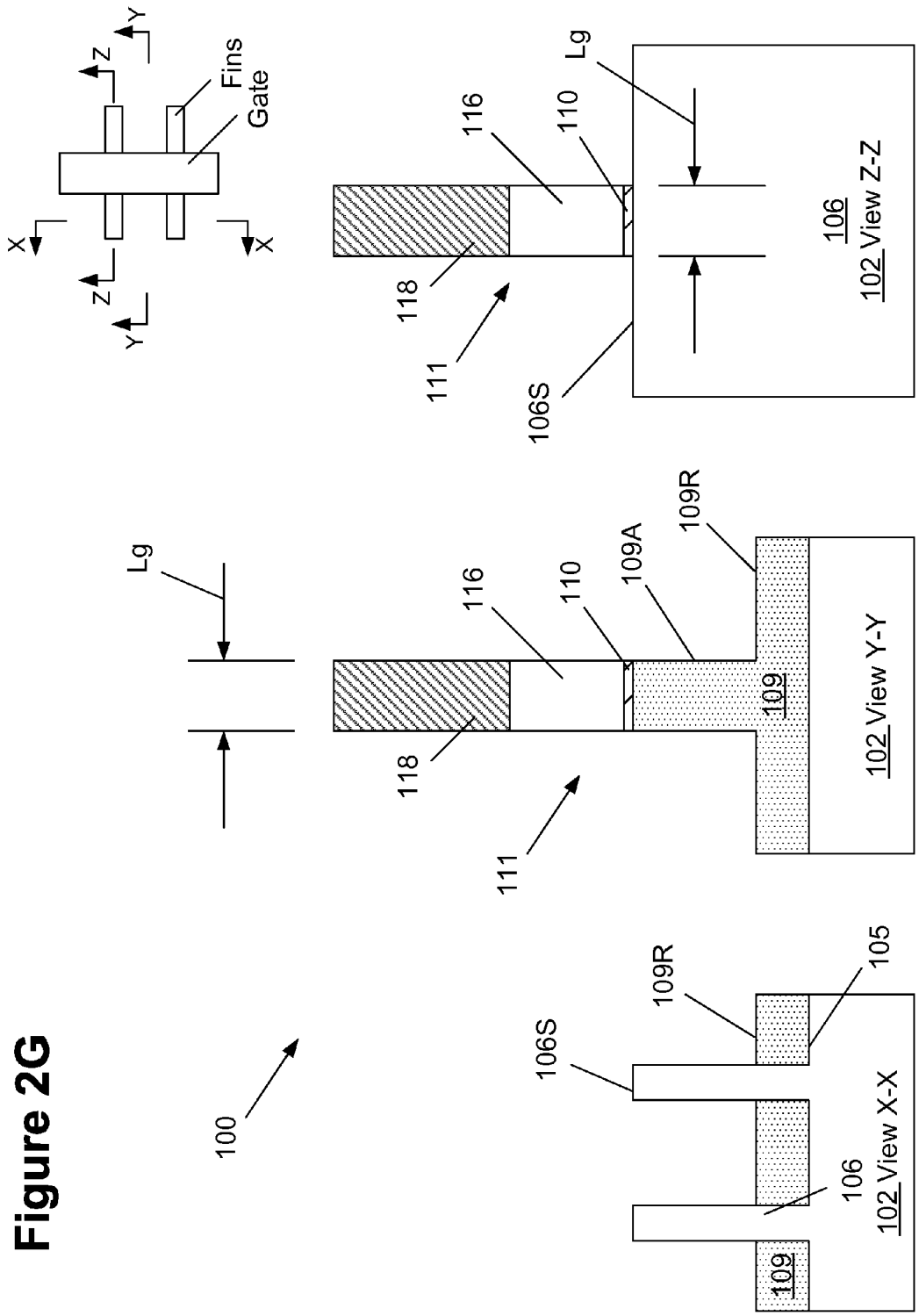

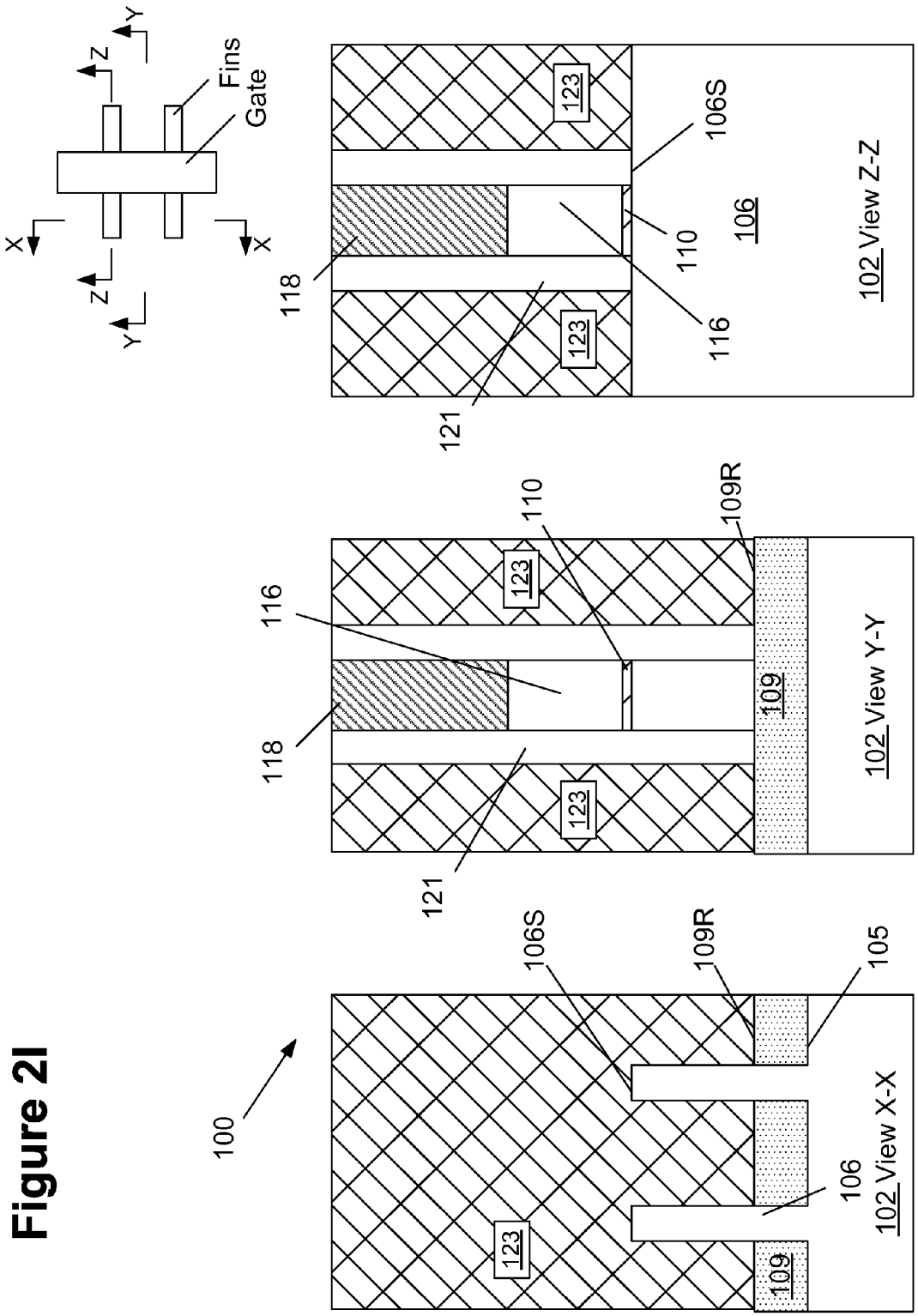

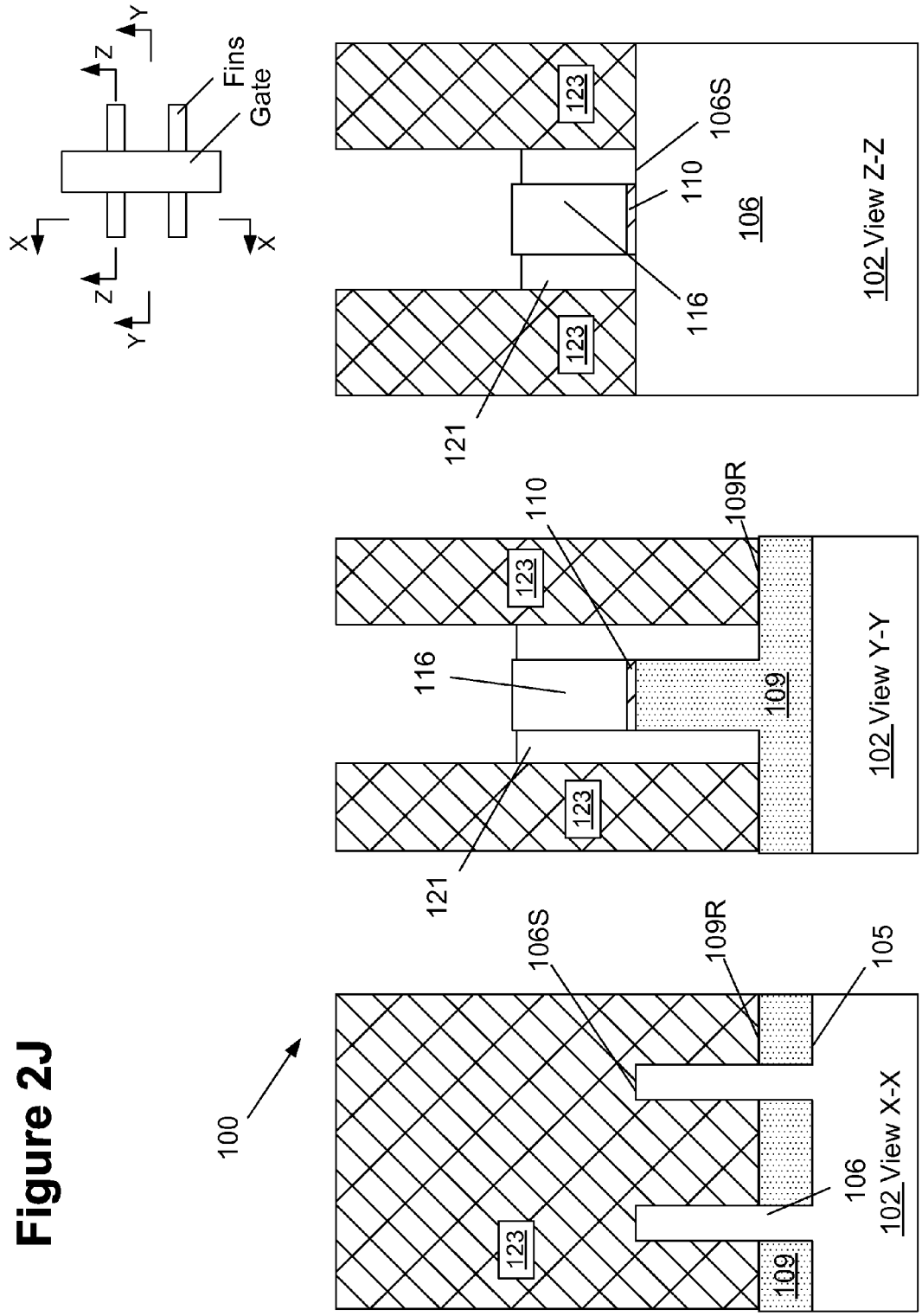

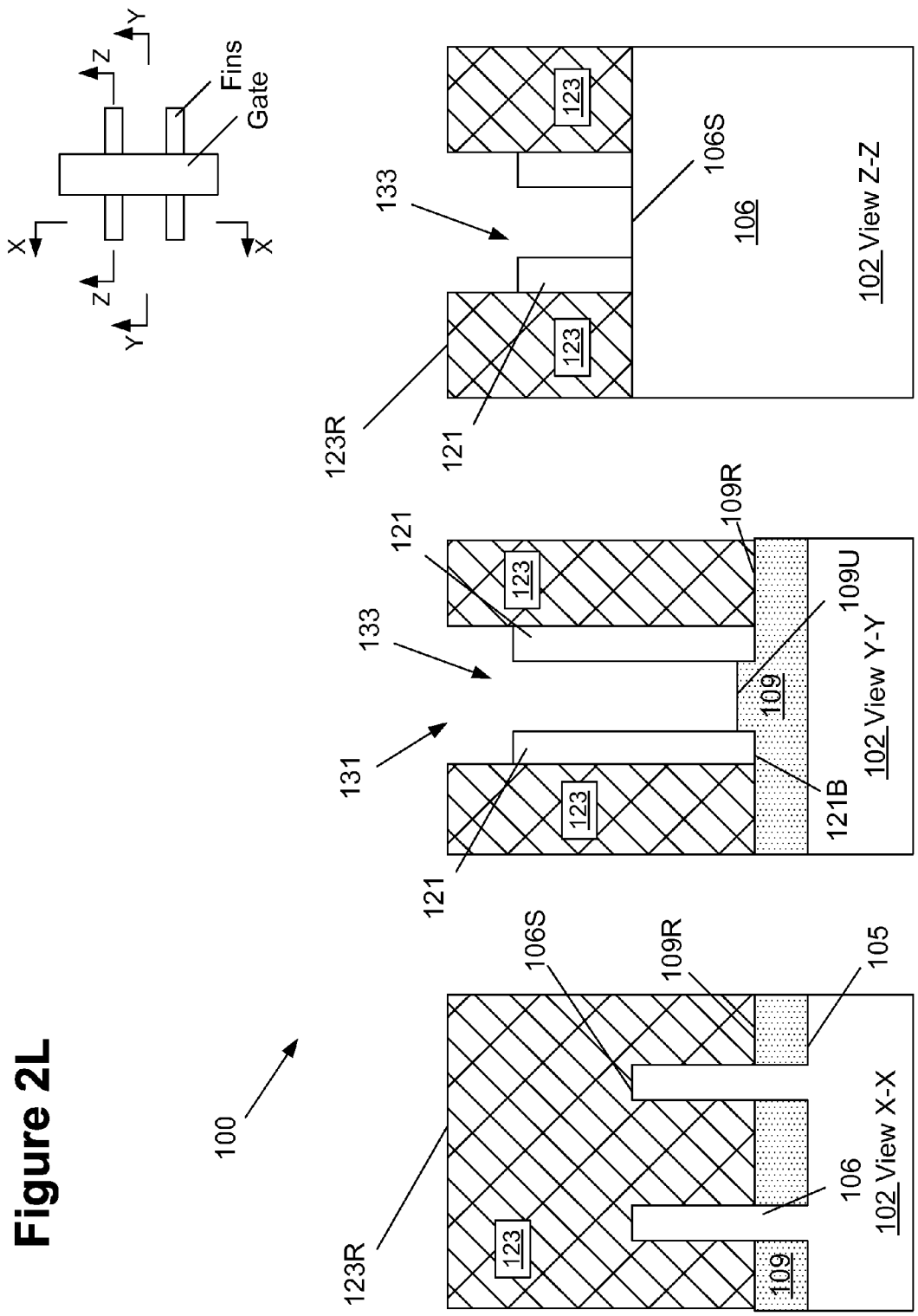

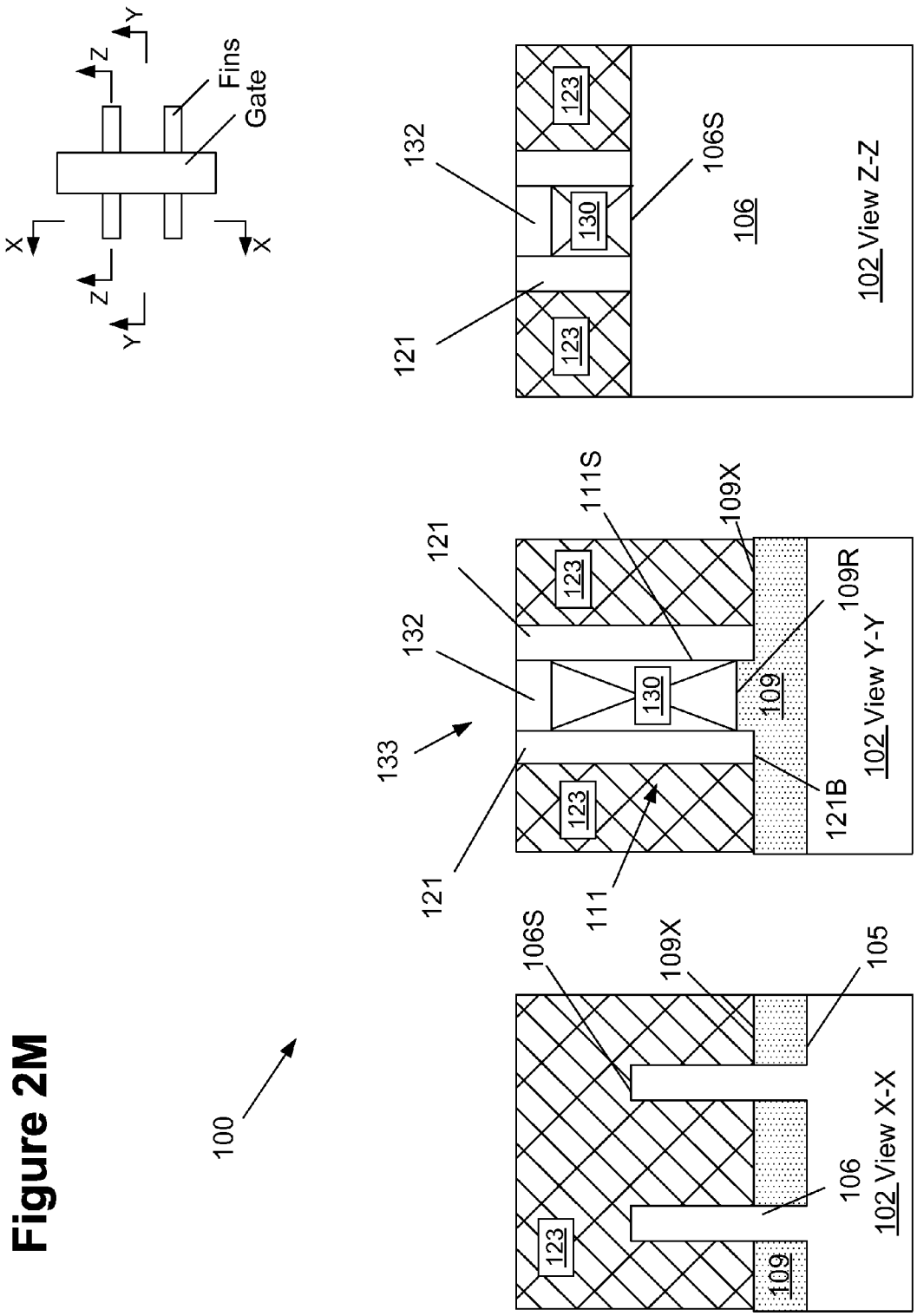

METHODS OF FORMING REPLACEMENT GATE STRUCTURES ON FINFET DEVICES AND THE RESULTING DEVICES

BACKGROUND OF THE INVENTION

1. Field of the Invention

Generally, the present disclosure relates to the manufacture of semiconductor devices, and, more specifically, to various novel methods of forming replacement gate structures on FinFET devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, sidewall spacers 18 and a gate hard mask 20. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and an axial length 14L. The direction of current travel when the device 10 is operational, i.e., the gate length (GL) of the device 10, corresponds to the direction of the axial length of the fins 14. The portions of the fins 14 covered by the gate structure 16 is the channel region of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes to form additional semiconductor material on the fins to reduce the contact resistance in the source/drain regions of the device 10.

FIGS. 1B-1E depict a typical formation process for forming fins 14 and gate structures 16 for FinFET devices. With reference to FIG. 1B, the fins 14 are typically formed by performing an etching process through a patterned hard mask layer 11 to define a plurality of trenches 13 in the substrate 12 so as to define the fins 14. A typical hard mask layer 11 is comprised of a layer of thermally grown silicon dioxide (pad oxide) formed on the substrate 12 and a layer of silicon nitride (pad nitride) formed on the pad oxide layer. The pad nitride and pad oxide layers are then patterned using photolithographic and etching techniques to thereby define the patterned hard mask layer 11. Thereafter, a layer of insulating material 22, e.g., silicon dioxide, is blanket-deposited across the substrate 12 such that it over-fills the trenches 13 and its as-deposited upper surface is positioned above the upper surface of the patterned hard mask layer 11. Then, a chemical mechanical polishing (CMP) process is performed on the layer of insulating material 22 so as to planarize its upper surface 22S with the upper surface 11S of the patterned masking layer 11 (this is the situation depicted in FIG. 1B). At this point in the process flow, the patterned masking layer 11 may be removed from above the upper surface 14S of the fins 14 by performing a selective etching process. In other process flows, the planarization process may be performed until the upper surface 22S of the insulating material is substantially planar with the upper surface 14S of the fins 14, i.e., the planarization process may be performed until such time as the patterned masking layer 11 is removed.

FIG. 1C depicts the device after several process operations were performed. First, the patterned masking layer 11 shown in FIG. 1B was removed either by etching or by performing a CMP process. Next, a recess etching process was performed on the layer of insulating material 22 such that, after the recess etching process was completed, it has a recessed upper surface 22R that is at a desired height level within the trenches 13 so as to establish the final approximate fin height for the fins 14 of the device 10. This recess etching process is sometimes referred to as a "fin-reveal" process because it reveals portions of the previously covered fins 14. Note that, in the typical prior art process flow, the layer of insulating material 22 is recessed within the trenches 13 prior to the formation of any materials for the gate structures.

FIG. 1D depicts the device 10 after several process operations were performed. First, a sacrificial gate insulation material 17, e.g., silicon dioxide, was formed across the substrate 12 and in the trenches 13 by performing a conformal deposition process. Next, a layer of sacrificial gate material 16M for the sacrificial gate, e.g., amorphous silicon, is blanket-deposited across the substrate 12 so as to over-fill the trenches 13. Due to the uneven underlying topography of the fins 14 and trenches 13, the sacrificial gate material 16M has an uneven as-deposited upper surface 16D that is simplistically depicted by the dashed line in FIG. 1D. Due to the uneven topography of the upper surface 16D, a CMP process is performed to produce a substantially planar upper surface 16S for the layer of sacrificial gate material 16M. Thereafter, a layer of gate hard cap material 20M is blanket-deposited above the planarized upper surface 16S of the layer of sacrificial gate material 16M.

FIG. 1E depicts the device 10 after the layers 20M and 16M were patterned to define a sacrificial gate structure 16 and a gate hard mask 20, and after the sidewalls spacers 18 were formed for the device 10. FIG. 1E is a cross-sectional view of the device 10 taken under the gate structure 16 and across the fins 14, wherein the recessed layer of insulating material 22 (not shown in FIG. 1A) is positioned between the fins 14. The device 10 depicted in FIG. 1E is a tri-gate (or triple gate) FinFET device. That is, during operation, a conductive region 26 (shown only on the middle fin in FIG. 1E) will be established that provides a path or channel for current to flow from the source region to the drain region. In advanced technologies, the fin width 14W (see FIG. 1A) is so small that the conductive region 26 may be comparable to the fin width 14W. The conductive region 26 forms inward of the side surfaces 14S and below the top surface 14T of the fins 14.

For many early device technology generations, the gate electrode structures of most transistor elements were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate structures comprised of a high-k gate insulation layer (k value of 10 or greater) and one or more metal layers, a so-called high-k dielectric/metal gate (HK/MG) configuration, have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique which is particularly effective in threshold voltage control. In the replacement gate technique, a so-called "dummy" or sacrificial gate structure (e.g., the gate structure 16 shown in FIG. 1E) is initially formed and remains in place as many process operations are performed to form the device, e.g., the formation of doped source/drain regions, performing an anneal process to activate the dopants and repair damage to the substrate caused by the ion implantation processes. At some point in the process flow after the source/drain regions are formed, the sacrificial gate structure is removed to define a gate cavity where the final HK/MG gate structure for the device is formed.

One problem encountered with traditional fabrication techniques used to manufacture FinFET devices is related to topography control. As indicated above (FIG. 1D), the as-deposited upper surface 16D of the layer of sacrificial gate material 16M is very uneven and non-planar and must be planarized before the formation of the layer of gate hard cap material 20M above the substrate 12. This is particularly problematic for extremely scaled FinFET devices, e.g., for 10 nm and beyond FinFET technologies, where the fin pitch is extremely small. The planarization process that is performed to planarize the as-deposited upper surface 16D of the layer of sacrificial gate material 16M is a timed process, i.e., the polishing does not stop on another material layer. Thus, the thickness of the sacrificial gate material layer 16M above the upper surface of the fins 14 is controlled by the duration of the polishing process. Any variation in the polishing rate and/or duration of this polishing process causes undesirable variation in the thickness of the gate material. Such variations can occur within a particular wafer, from wafer-to-wafer and/or from lot-to-lot, and can create further manufacturing problems.

Yet another problem encountered when forming FinFET devices using these prior art techniques is the lack of uniformity in the gate length (Lg) of the device 10 due to having to pattern the relatively tall (or thick) sacrificial gate material 16M in the trenches 13 between the fins 14 above the recessed layer of insulating material 22. This problem will be further described with reference to FIGS. 1F-1G. More specifically, FIG. 1F is a cross-sectional view that is taken through the long axis 14L of a fin 14 transverse to the long axis of the gate structure 16, i.e., in the current transport direction of the device, while FIG. 1G is a cross-sectional view taken through the space between the fins 14 in a direction that is substantially parallel to the gate length direction (i.e., the current transport direction) of the device 10. The upper surface 14S of the fin 14 is also depicted. As indicated in FIGS. 1F-1G, the thickness T1 of the sacrificial gate electrode material 16 above the upper surface 14S of the fin 14 is much less than the thickness T2 of the sacrificial gate electrode material 16 positioned in the trenches between the fins 14. Ideally, the gate length (Lg) of the portion of the fin 14 surrounded by the gate structure 16 will be substantially uniform and correspond to the gate length (Lg) anticipated by the design process. However, as indicated in FIG. 1G, in some cases, the sidewalls 16S of the sacrificial gate electrode material 16 may tend to flare outwardly when etched due, at least in part, to the relatively large thickness T2 of the sacrificial gate electrode material 16 in the trenches 13 between the fins 14. As a result of this flaring, the gate length (Lg) of the device near a bottom of the channel region of the device is wider than the gate length (Lg) of the device near the upper surface 14S of the fin 14. This variation in gate length can lead to problems such as slower device operation, etc. Depending on the chemistry, time and surface passivation characteristics of the sacrificial gate etch process, the opposite situation, where 16S is narrower than the gate length (Lg), may also occur. In any case, variations in uniformity of the gate length (Lg) along the fin sidewall are undesirable.

The present disclosure is directed to methods of forming replacement gate structures on FinFET devices and the resulting devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming replacement gate structures on FinFET devices and the resulting devices. One illustrative method disclosed herein includes, among other things, forming a fin having an upper surface and a plurality of side surfaces, forming at least one layer of insulating material above the substrate such that an upper surface of the at least one layer of insulating material is substantially planar and positioned at a level that is above a level of the upper surface of the fin, forming a layer of sacrificial gate material on the substantially planar upper surface of at least one layer of insulating material, the layer of sacrificial gate material having an as-deposited upper surface and a substantially uniform thickness, and forming a layer of gate cap material on the as-deposited upper surface of the layer of sacrificial gate material. In this embodiment, the method further includes performing at least one etching process to define a patterned sacrificial gate structure comprised of at least the gate cap material and the sacrificial gate material, forming a sidewall spacer adjacent the patterned sacrificial gate structure, removing the patterned sacrificial gate structure and portions of the at least one layer of insulating material positioned between the spacers so as to thereby define a replacement gate cavity and thereby expose the upper surface and side surfaces of the fin within the replacement gate cavity, and forming a replacement gate structure in the replacement gate cavity around the exposed upper surface and side surfaces of the fin.

BRIEF DESCRIPTION OF THE DRAWINGS

The disclosure may be understood by reference to the following description taken in conjunction with the accompanying drawings, in which like reference numerals identify like elements, and in which:

FIGS. 1A-1G depict an illustrative prior art FinFET device; and

FIGS. 2A-2M depict various illustrative novel methods disclosed herein for forming replacement gate structures on FinFET devices and the resulting novel devices.

Figure 1E:
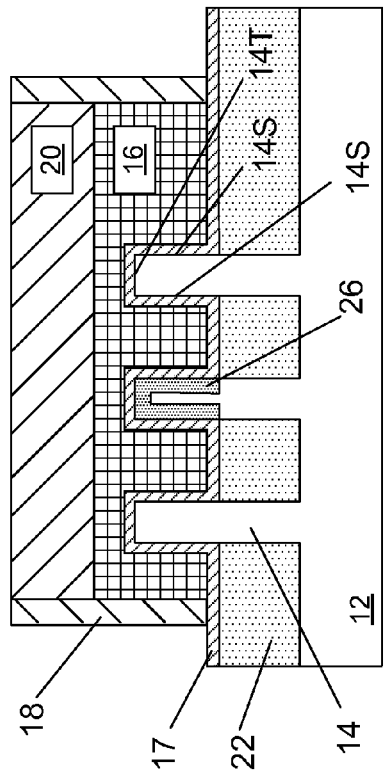
Figure 1F:
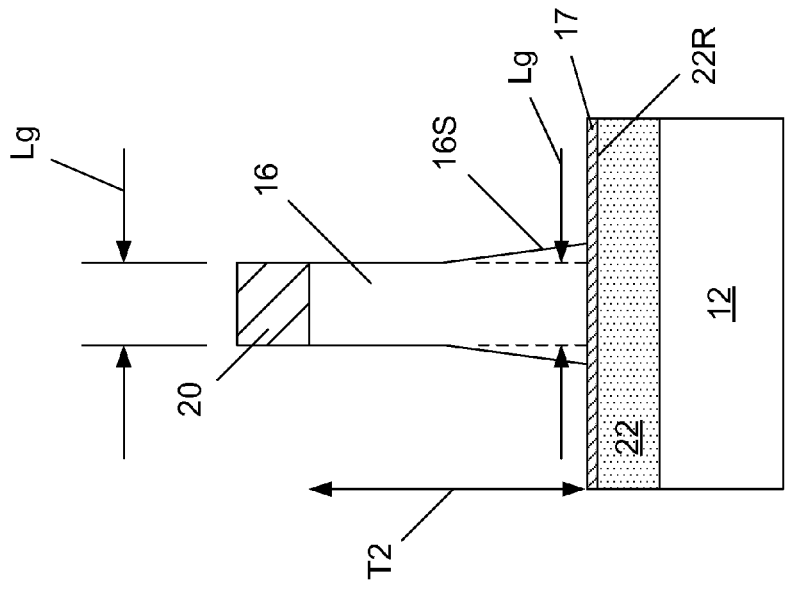
Figure 1G:
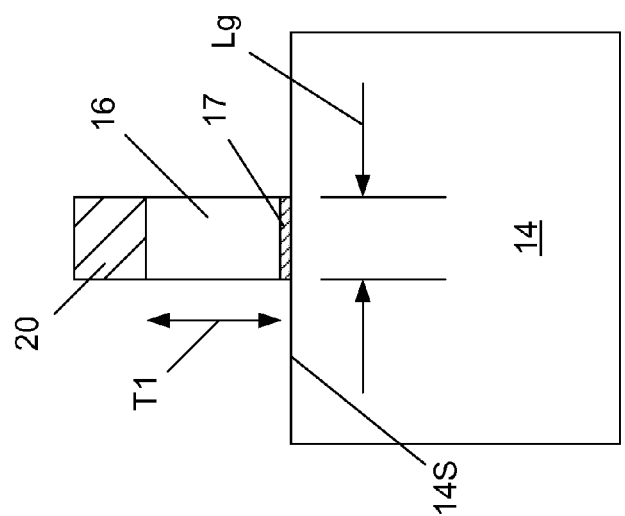

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 2A-2M present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view taken through a source/drain region of the device 100 in a direction that is transverse to the long axis of the fins, i.e., in a direction that is substantially parallel to the gate width direction of the device 100, the view "Y-Y" is a cross-sectional view that is taken through the space between the fins in a direction that is substantially parallel to the gate length direction (i.e., the current transport direction) of the device 100, and the view "Z-Z" is a cross-sectional view that is taken through the long axis of a fin transverse to the long axis of the gate structure, i.e., in the current transport direction of the device.

In the examples depicted herein, the FinFET device 100 will be formed in and above a semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIG. 2A depicts the device 100 at a point in fabrication wherein several process operations have been performed. First, a patterned etch mask 104, e.g., a combination of a silicon dioxide layer (e.g., a pad oxide) and a silicon nitride layer (e.g., a pad nitride), was formed above the substrate 102. In some cases, the pad oxide layer (not separately shown) may be omitted if desired. Thereafter, one or more etching processes were performed through the patterned etch mask 104 so as to define a plurality of trenches 105 in the substrate 102. This results in the formation of a plurality of fins 106. The illustrative FinFET device 100 disclosed herein will be depicted as being comprised of two illustrative fins 106. However, as will be recognized by those skilled in the art after a complete reading of the present application, the methods and devices disclosed herein may be employed when manufacturing FinFET devices having any number of fins. The fins 106 extend laterally into and out of the drawing page in the current transport direction of the device 100 and into what will become the source/drain regions of the device 100.

With continuing reference to FIG. 2A, the overall size, shape and configuration of the trenches 105 and the fins 106 may vary depending on the particular application. The depth and width of the trenches 105 may vary depending upon the particular application. In one illustrative embodiment, based on current day bulk technology, the overall depth (relative to the upper surface of the substrate 102) of the trenches 105 may range around about 100 nm. In the illustrative examples depicted in the attached figures, the trenches 105 and the fins 106 will be simplistically depicted as having generally rectangular portions and sections. In an actual real-world device, the sidewalls of the trenches 105 may be somewhat tapered, although such tapering is not depicted in the drawings. Thus, the size and configuration of the trenches 105 and the fins 106, and the manner in which they are made, should not be considered a limitation of the present invention. For ease of disclosure, only the substantially rectangular-shaped trenches 105 and fins 106 having a substantially rectangular-shaped cross-sectional configuration will be depicted in the drawings.

Figure 2B:
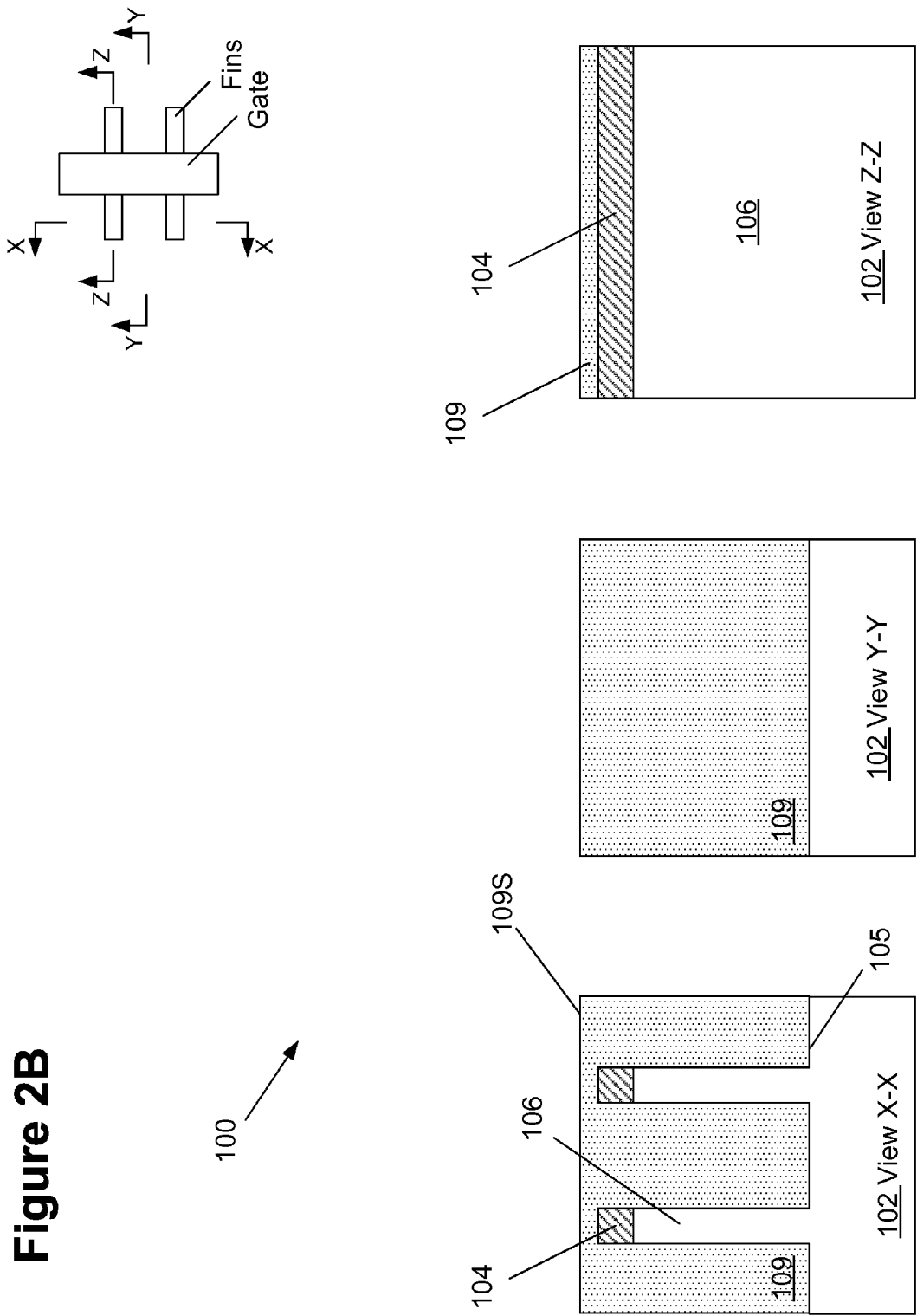

FIG. 2B depicts the FinFET device 100 after a layer of insulating material 109 was formed so as to over-fill the trenches 105 between the fins 106. That is, the layer of insulating material 109 is formed such that its upper surface 109S is positioned above the patterned masking layer 104. The layer of insulating material 109 may be comprised of, for example, silicon dioxide, a HARP oxide, HDP oxide, flowable oxide, etc.

Figure 2C:
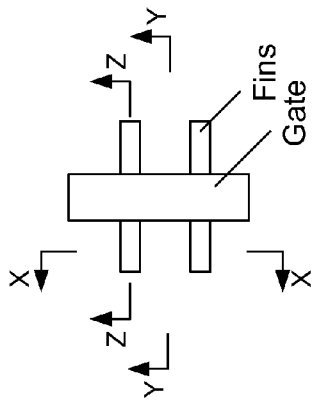
Figure 2C:
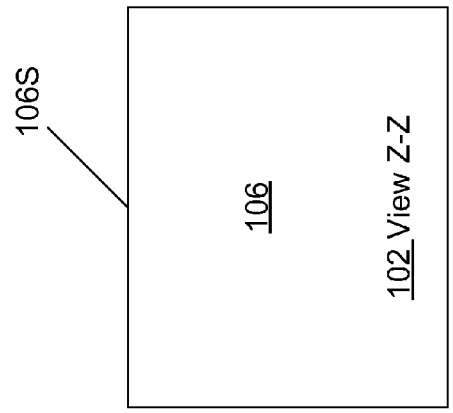
Figure 2C:
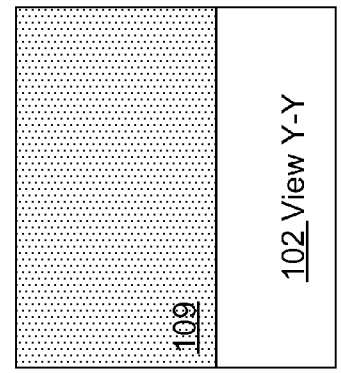
Figure 2C:
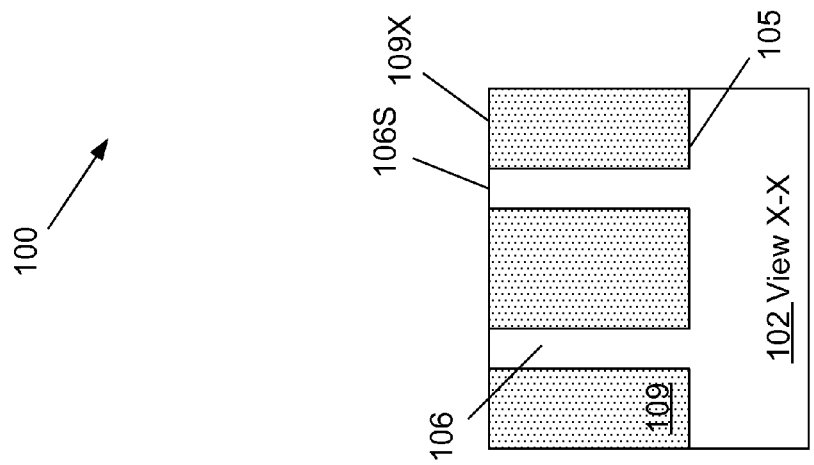

FIG. 2C depicts the FinFET device 100 after one or more CMP processes were performed to remove portions of the layer of insulating material 109 and the patterned hard mask layer 104. These processes result in the layer of insulating material 109 having a polished surface 109X and in the exposure of the upper surface 106S of the fins 106.

FIG. 2D depicts the FinFET device 100 after a thin layer of silicon dioxide 110, e.g., 3-5 nm, was deposited on the exposed upper surfaces 106S of the fins 106 and on the planarized upper surface 109X of the layer of insulating material 109. Note that, unlike the traditional process flow discussed in the background section of this application, in the novel methods disclosed herein, the layer of insulating material 109 is not recessed prior to the formation of the thin layer of silicon dioxide 110, i.e., the novel process flow disclosed herein is in stark contrast to the flow shown in FIGS. 1C-1D wherein the layer of insulating material 22 is recessed prior to the formation of the layer of silicon dioxide 17.

The inventions disclosed herein will be disclosed in the context of forming a gate structures for the FinFET device 100 by performing a replacement gate process. Accordingly, FIG. 2E depicts the device 100 after layers of material for a sacrificial gate material 116 and a gate cap (hard mask) layer 118 were deposited above the layer of silicon dioxide 110. In general, the sacrificial gate material 116 is comprised of a material such as polysilicon or amorphous silicon, while the gate cap layer 118 is comprised of a material such as silicon nitride. The thickness of these materials may vary depending upon the particular application. Note that, unlike prior art processing techniques, the sacrificial gate material 116 is formed on a substantially planar surface, i.e., the layer of silicon dioxide 110. Thus, unlike prior art FinFET manufacturing techniques, there is no need to planarize the as-deposited upper surface 116S of the sacrificial material layer 116. Moreover, the thickness of the sacrificial material layer 116 may be controlled very precisely by controlling the deposition parameters, and the thickness of the sacrificial material layer 116 should be substantially uniform across the substrate 102. As depicted, in one embodiment, the gate cap material layer 118 is formed on and in contact with the as-deposited upper surface 116S of the sacrificial material layer 116.

Figure 2F:
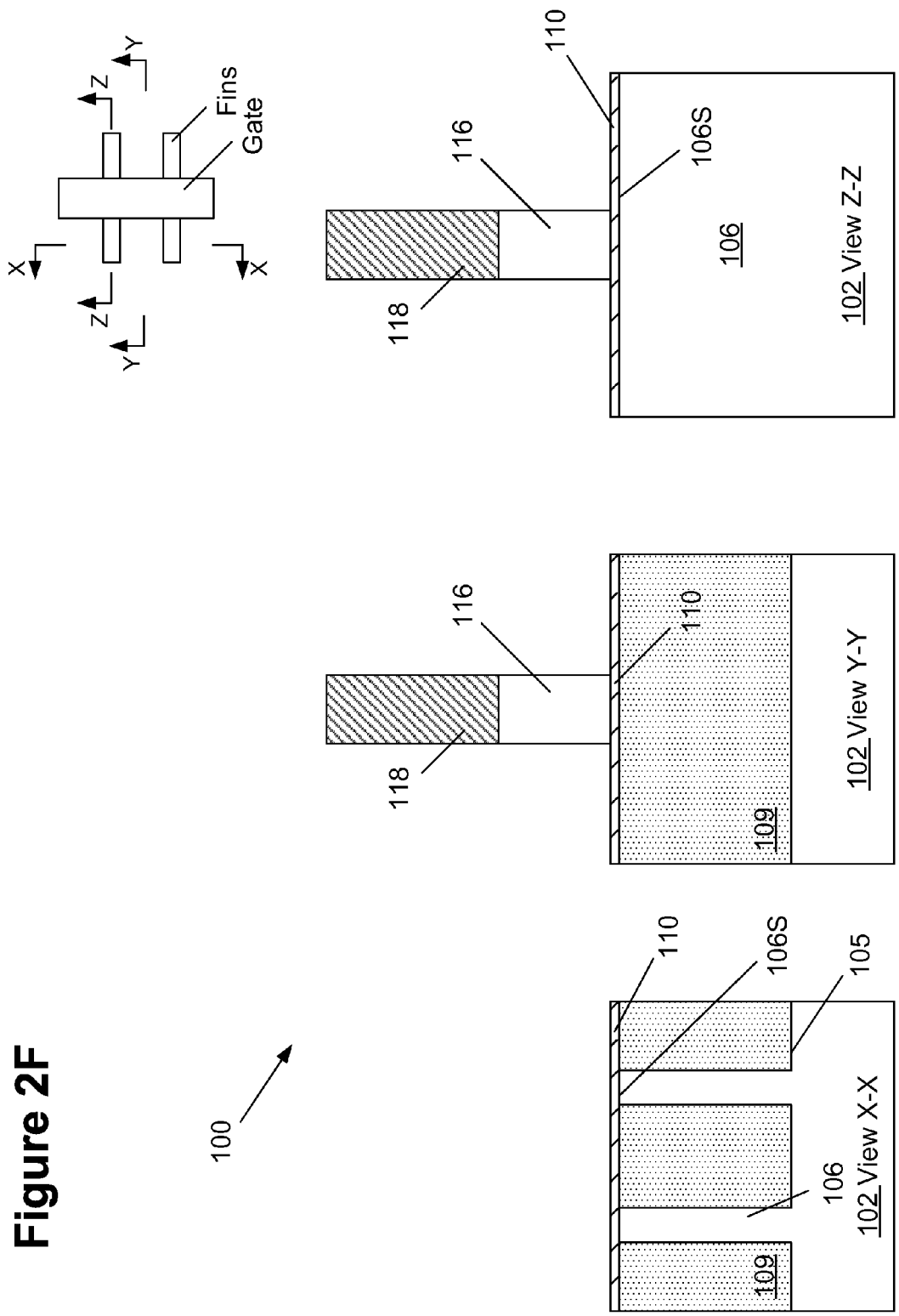

FIG. 2F depicts the device 100 after the sacrificial gate material 116 and the gate cap layer 118 were patterned using traditional masking and etching techniques. The layer of silicon dioxide 110 serves as an etch stop when etching at least the sacrificial material layer 116.

FIG. 2G depicts the FinFET device 100 after a timed, anisotropic recess etching process was performed to remove the exposed portions of the layer of silicon dioxide 110 and a portion of the layer of insulating material 109. The recess etching process was performed for a sufficient duration such that the layer of insulating material 109 has a recessed upper surface 109R that is positioned at a desired height level within the trenches 105. At this point, a patterned sacrificial gate structure 111 is defined that is comprised of the patterned gate cap material 118, the patterned sacrificial gate material 116, the layer of silicon dioxide 110 and a portion of the layer of insulating material 109. Note that, by using the methods disclosed herein, the sidewalls 109A of the etched layer of insulating material 109 are substantially vertical, thereby providing better control of the gate length dimension (Lg) as compared to prior art processing techniques wherein etching a relatively tall (or thick) sacrificial gate material resulted in undesirable flaring, as described in the background section of this application.

Figure 2H:
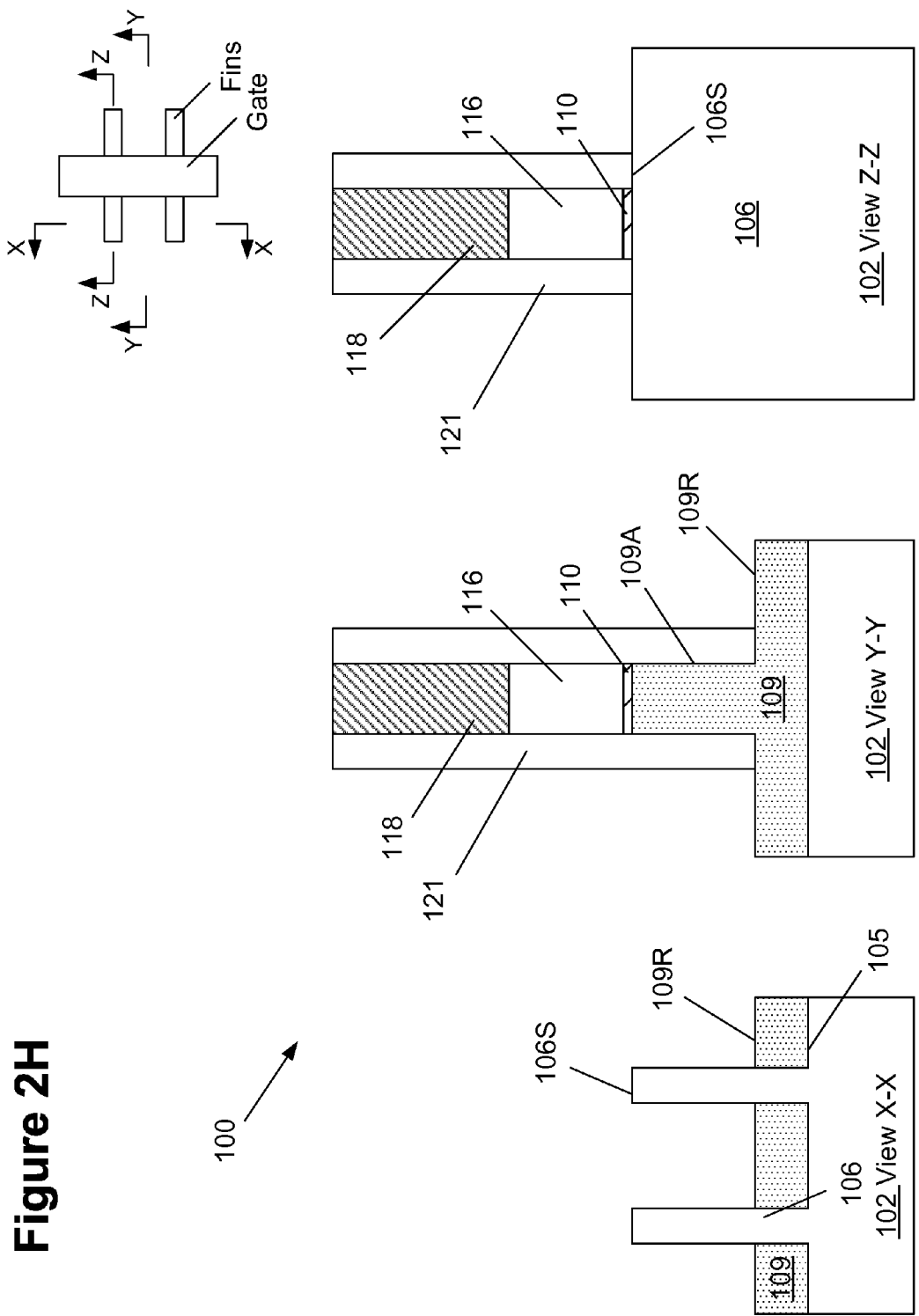

FIG. 2H depicts the FinFET device 100 after simplistically depicted sidewall spacers 121 were formed adjacent the patterned sacrificial gate material 116, the patterned gate cap layer 118, the patterned layer of silicon dioxide 110 and the sidewalls 109A of the etched portions of the layer of insulating material 109. The sidewall spacers 121 were formed by depositing a layer of spacer material (e.g., silicon nitride) and thereafter performing an anisotropic etching process. The spacers 121 may be of any desired thickness. Although not depicted, at this point in the process, additional epi semiconductor material may be formed on the source/drain portions of the fins 106 positioned laterally outside of the spacers 121. The additional source/drain epi material can be "merged" or "unmerged" depending on the duration of the epi growth process around the fins 106. The source-drain epi material can be further "embedded" or "cladded" depending on the use of a recess process for fins 106 before the epi growth.

FIG. 2I depicts the FinFET device 100 after another layer of insulating material 123, such as silicon dioxide, was blanket-deposited above the device 100. Then, one or more CMP processes were performed to planarize the upper surface of the insulating material 123 with the upper surface of the gate cap layer 118.

FIG. 2J depicts the FinFET device 100 after a timed, recess etching process was performed to remove the gate cap layer 118 and portions of the spacers 121 selectively relative to the surrounding structures. This process operation exposes the sacrificial gate material 116 for removal.

Figure 2K:
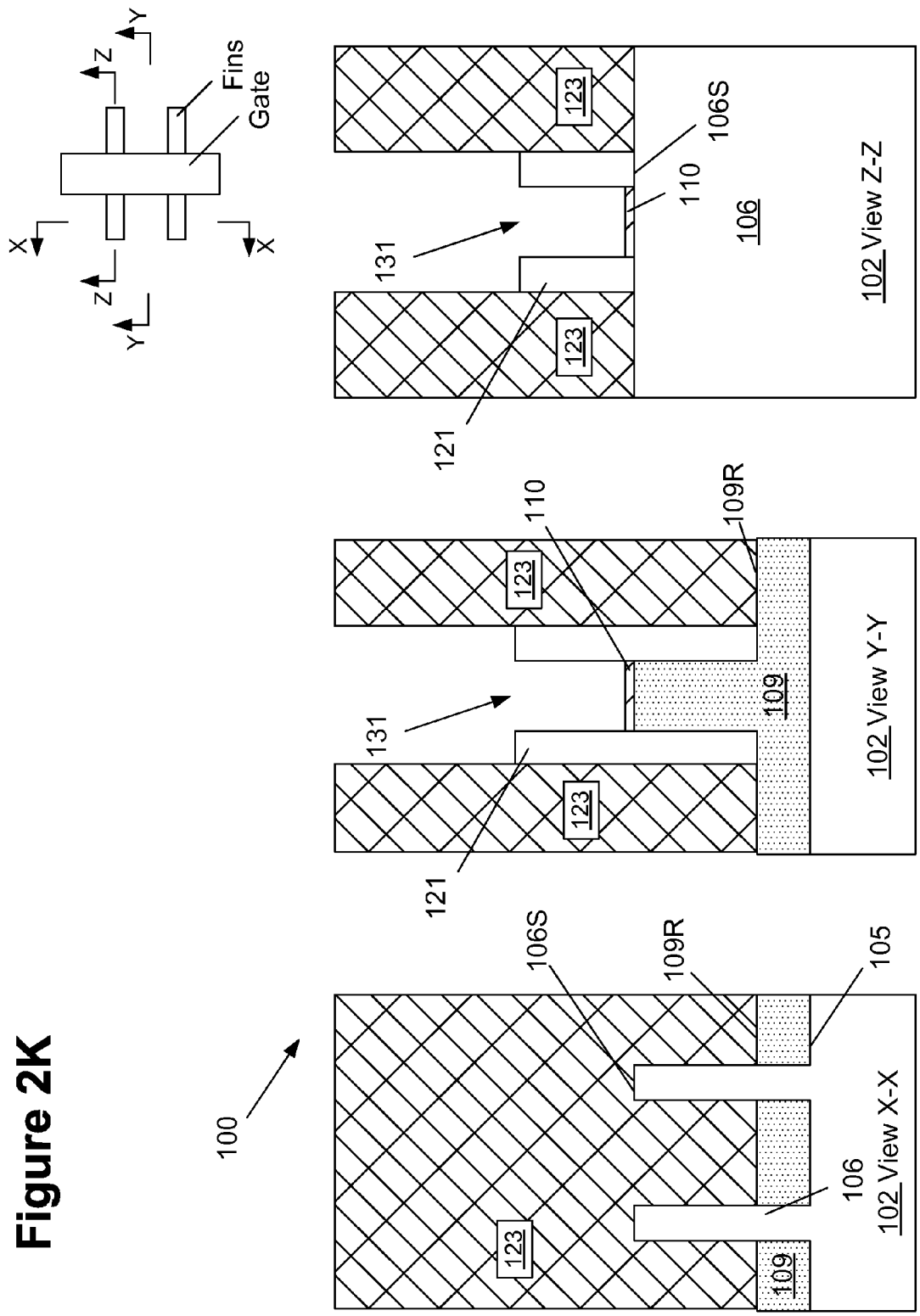

FIG. 2K depicts the FinFET device 100 after one or more etching processes were performed to remove the sacrificial gate material 116 relative to the layer of silicon dioxide 110 and the surrounding materials. The process operation results in the formation of a cavity 131 and exposes the layer of silicon dioxide 110 positioned between the spacers 121.

FIG. 2L depicts the FinFET device 100 after one or more timed etching processes were performed through the cavity 131 to remove the exposed layer of silicon dioxide 110 and portions of the layer of insulating material 109 positioned between the spacers 121. Ideally, the upper surface 109U of the layer of insulating material 109 between the spacers 121 should be even with or above the bottom 121B of the spacers 121. Also note that this recess etching process also consumes some of the layer of insulating material 123, but even after the recess etching process, the recessed upper surface 123R of the layer of insulating material 123 is positioned at a level that is above the level of the upper surface of the spacers 121. These process operations result in the formation of a replacement gate cavity 133 between the spacers 121 where a final replacement gate structure for the device 100 will be formed.

FIG. 2M depicts the FinFET device 100 after the formation of a replacement gate structure 130 (including a high-k gate insulation layer) and a gate cap (hard mask) layer 132 (e.g., silicon nitride) in the replacement gate cavity 133. The replacement gate structure 130 depicted herein is intended to be representative in nature of any type of replacement gate structure that may be employed in manufacturing integrated circuit products. Typically, a pre-clean process will be performed in an attempt to remove all foreign materials from within the replacement gate cavity 133 prior to forming the various layers of material that will become part of the replacement gate structure 130. Thereafter, the final gate structure 130 may be formed by sequentially depositing the materials of the gate structure into the replacement gate cavity 133 and above the layer of insulating material 123 and then performing a CMP process to remove excess materials above the layer of insulating material 123. Next, a recess etching process will be performed to recess the materials in the gate cavity 133 to make room for the gate cap layer 132. Then, the gate cap layer 132 was formed in the replacement gate cavity 133 above the recessed gate materials. The gate cap layer 132 may be comprised of a variety of materials, e.g., silicon nitride, and it may be formed by overfilling the remaining portions of the replacement gate cavity 133 with the gate cap material and thereafter performing a CMP process to remove excess materials. As noted previously, the gate structure 130 may be comprised of a layer of high-k insulating material (k value of 10 or greater) and one or more layers of metal.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a replacement gate structure for a FinFET device, comprising:
    forming a plurality of trenches in a semiconductor substrate so as to define a fin having an upper surface and a plurality of side surfaces;
    forming at least one layer of insulating material above said substrate, said at least one layer of insulating material having a substantially planar upper surface and comprising a first layer of insulating material that is positioned in said plurality of trenches and a second layer of insulating material that is positioned on an upper surface of said first layer of insulating material, wherein said upper surface of said first layer of insulating material is substantially planar with said upper surface of said fin and an upper surface of said second layer of insulating material is positioned at a level that is above a level of said upper surface of said fin;
    forming a layer of sacrificial gate material on said substantially planar upper surface of said at least one layer of insulating material, said layer of sacrificial gate material having an as-deposited upper surface and a substantially uniform thickness;
    forming a layer of gate cap material on said as-deposited upper surface of said layer of sacrificial gate material;
    performing at least one etching process to define a patterned sacrificial gate structure comprised of at least said gate cap material and said sacrificial gate material;
    forming sidewall spacers adjacent said patterned sacrificial gate structure;
    removing said patterned sacrificial gate structure and portions of said at least one layer of insulating material positioned between said spacers so as to thereby define a replacement gate cavity and thereby expose said upper surface and said side surfaces of said fin within said replacement gate cavity; and
    forming a replacement gate structure in said replacement gate cavity around said exposed upper surface and side surfaces of said fin.

2. The method of claim 1, wherein said at least one layer of insulating material is comprised of silicon dioxide and said layer of sacrificial gate material is comprised of amorphous silicon or polysilicon.

3. The method of claim 1, wherein said replacement gate structure is comprised of a high-k gate insulation layer and at least one layer of metal.

4. The method of claim 1, wherein performing said at least one etching process to define said patterned sacrificial gate structure also defines a recessed upper surface for said at least one layer of insulating material positioned in said trenches, wherein said recessed upper surface of said at least one layer of insulating material positioned in said trenches is positioned at a level that is below said level of said upper surface of said fin.

5. A method of forming a replacement gate structure for a FinFET device, comprising:
    forming a plurality of trenches in a semiconductor substrate so as to define a fin having an upper surface and a plurality of side surfaces;
    forming at least one layer of insulating material above said substrate, said at least one layer of insulating material having a substantially planar upper surface and comprising a first layer of insulating material that is positioned in said plurality of trenches and a second layer of insulating material that is positioned on an upper surface of said first layer of insulating material, wherein said upper surface of said first layer of insulating material is substantially planar with said upper surface of said fin and an upper surface of said second layer of insulating material is positioned at a level that is above a level of said upper surface of said fin;
    forming a layer of sacrificial gate material on said substantially planar upper surface of said at least one layer of insulating material, said layer of sacrificial gate material having a substantially planar, as-deposited upper surface;
    forming a layer of gate cap material on said substantially planar, as-deposited upper surface of said layer of sacrificial gate material;
    performing at least one etching process to define a patterned sacrificial gate structure comprised of said gate cap material, said sacrificial gate material and said at least one layer of insulating material and to define a recessed upper surface for said at least one layer of insulating material positioned in said trenches;
    forming sidewall spacers adjacent said patterned sacrificial gate structure and above said recessed upper surface of said at least one layer of insulating material;
    removing said patterned sacrificial gate structure and portions of said at least one layer of insulating material positioned between said spacers so as to thereby define a replacement gate cavity and thereby expose said upper surface and said side surfaces of said fin within said replacement gate cavity; and forming a replacement gate structure in said replacement gate cavity around said exposed upper surface and side surfaces of said fin.

6. The method of claim 5, wherein said layer of sacrificial gate material has a substantially uniform thickness.

7. The method of claim 5, wherein said at least one layer of insulating material is comprised of at least one of a flowable oxide material, an HDP oxide material or a HARP oxide material.

8. A method of forming a replacement gate structure for a FinFET device, comprising:

forming a plurality of trenches in a semiconductor substrate so as to define a fin having an upper surface and a plurality of side surfaces;

forming a first layer of insulating material in said plurality of trenches such that an upper surface of said first layer of insulating material is substantially planar with said upper surface of said fin and said upper surface of said fin is exposed;

forming a second layer of insulating material on said upper surface of said first layer of insulating material and on said exposed upper surface of said fin;

forming a layer of sacrificial gate material on said second layer of insulating material, said layer of sacrificial gate material having an as-deposited upper surface;

forming a layer of gate cap material on said as-deposited upper surface of said layer of sacrificial gate material;

performing at least one etching process to pattern said layer of gate cap material, said layer of sacrificial gate material, said second layer of insulating material, and said first layer of insulating material so as to define a patterned sacrificial gate structure and define a recessed upper surface for said first layer of insulating material within said trenches, wherein said recessed upper surface for said first layer of insulating material positioned in said trenches is positioned at a level that is below a level of said upper surface of said fin;

forming sidewall spacers adjacent said patterned sacrificial gate structure and above said recessed upper surface of said first layer of insulating material;

removing said patterned gate cap material, said patterned sacrificial gate material, said patterned second layer of insulating material and at least portions of said patterned first layer of insulating material positioned between said spacers so as to thereby define a replacement gate cavity and thereby expose said upper surface and said side surfaces of said fin within said replacement gate cavity; and forming a replacement gate structure in said replacement gate cavity around said exposed upper surface and side surfaces of said fin.

9. The method of claim 8, wherein said layer of sacrificial gate material has a substantially uniform thickness.

10. A method of forming a replacement gate structure for a FinFET device, comprising:

forming a plurality of trenches in a semiconductor substrate so as to define a fin having an upper surface and a plurality of side surfaces;

forming at least one layer of insulating material above said substrate, said at least one layer of insulating material having a substantially planar upper surface and comprising a first layer of insulating material that is positioned in said plurality of trenches and a second layer of insulating material that is positioned on an upper surface of said first layer of insulating material, wherein said upper surface of said first layer of insulating material is substantially planar with said upper surface of said fin and an upper surface of said second layer of insulating material is positioned at a level that is above a level of said upper surface of said fin;

forming a layer of sacrificial gate material on said substantially planar upper surface of said at least one layer of insulating material, said layer of sacrificial gate material having an as-deposited upper surface and a substantially uniform thickness;

forming a layer of gate cap material on said as-deposited upper surface of said layer of sacrificial gate material;

performing at least one etching process to pattern said layer of gate cap material, said layer of sacrificial gate material and said at least one layer of insulating material so as to define a patterned sacrificial gate structure and define a recessed upper surface for said at least one layer of insulating material within said trenches, wherein said recessed upper surface for said at least one layer of insulating material positioned in said trenches is positioned at a level that is below said level of said upper surface of said fin; and forming sidewall spacers adjacent said patterned sacrificial gate structure and said first layer of insulating material and above said recessed upper surface of said first layer of insulating material.

11. The method of claim 10, further comprising removing said patterned sacrificial gate structure and portions of said at least one layer of insulating material positioned between said spacers so as to thereby define a replacement gate cavity and thereby expose said upper surface and said side surfaces of said fin within said replacement gate cavity.

12. The method of claim 11, further comprising forming said replacement gate structure in said replacement gate cavity around said exposed upper surface and side surfaces of said fin.

* * * * *